(12) United States Patent
Singer et al.

(10) Patent No.: US 10,651,346 B2
(45) Date of Patent: May 12, 2020

(54) ASSEMBLY INCLUDING A CARRIER HAVING A GLASS MATERIAL AND AN OPTOELECTRONIC SEMICONDUCTOR COMPONENT

(71) Applicant: OSRAM OLED GmbH, Regensburg (DE)

(72) Inventors: Frank Singer, Regenstauf (DE); Andreas Ploessl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/775,038

(22) PCT Filed: Nov. 10, 2016

(86) PCT No.: PCT/EP2016/077316
§ 371 (c)(1),
(2) Date: May 10, 2018

(87) PCT Pub. No.: WO2017/081184
PCT Pub. Date: May 18, 2017

(65) Prior Publication Data
US 2018/0374996 A1 Dec. 27, 2018

(30) Foreign Application Priority Data
Nov. 10, 2015 (DE) .......... 10 2015 119 343

(51) Int. Cl.
*H01L 33/48* (2010.01)
*H01L 33/50* (2010.01)
(Continued)

(52) U.S. Cl.
CPC ............ *H01L 33/486* (2013.01); *H01L 25/13* (2013.01); *H01L 33/483* (2013.01); *H01L 33/50* (2013.01);
(Continued)

(58) Field of Classification Search
None
See application file for complete search history.

(56) References Cited

U.S. PATENT DOCUMENTS 8,674,391 B2    3/2014  Brick
2001/0045573 A1  11/2001 Waitl et al.
(Continued)

FOREIGN PATENT DOCUMENTS

DE  10 2007 046 496 A1  4/2009
DE  10 2010 045 390 A1  3/2012
(Continued)

OTHER PUBLICATIONS

German Search Report dated Aug. 10, 2016, of corresponding German Application No. 10 2015 119 343.4.
(Continued)

*Primary Examiner* — Alexander G Ghyka
(74) *Attorney, Agent, or Firm* — DLA Piper LLP (US)

(57) ABSTRACT

An assembly includes a carrier including a glass material, including at least one recess, wherein at least one optoelectronic semiconductor component is arranged in the at least one recess of the carrier, and at least one surface of the semiconductor component connects to the carrier via a melted surface including glass.

20 Claims, 7 Drawing Sheets (51) Int. Cl.
*H01L 33/62* (2010.01)
*H01L 25/13* (2006.01)

(52) U.S. Cl.
CPC .... *H01L 33/62* (2013.01); *H01L 2224/04105* (2013.01); *H01L 2224/18* (2013.01); *H01L 2224/32225* (2013.01); *H01L 2224/73267* (2013.01); *H01L 2224/92244* (2013.01); *H01L 2924/15153* (2013.01); *H01L 2933/00* (2013.01)

(56) References Cited

U.S. PATENT DOCUMENTS

| | | | |
|---|---|---|---|
| 2008/0284310 | A1 | 11/2008 | Suehiro |
| 2009/0078948 | A1* | 3/2009 | Hoelen ............... H01L 33/60 257/98 |
| 2009/0085458 | A1* | 4/2009 | Murazaki ........... C09K 11/0883 313/487 |
| 2012/0299030 | A1 | 11/2012 | Brick |
| 2013/0240918 | A1 | 9/2013 | Herrmann et al. |
| 2014/0151742 | A1 | 6/2014 | Logunov et al. |
| 2016/0172547 | A1 | 6/2016 | von Malm |
| 2016/0300820 | A1 | 10/2016 | Sabathil et al. |

FOREIGN PATENT DOCUMENTS

| | | |
|---|---|---|
| DE | 10 2013 107 862 A1 | 1/2015 |
| DE | 10 2014 100 584 A1 | 7/2015 |
| EP | 0 933 823 A2 | 8/1999 |
| JP | 2006-286908 A | 10/2006 |
| JP | 2007-080884 A | 3/2007 |
| JP | 2008-034473 A | 2/2008 |
| JP | 2008-270563 A | 11/2008 |
| JP | 2008-288543 A | 11/2008 |
| JP | 2010-100743 A | 5/2010 |
| JP | 2013-519907 A | 5/2013 |
| WO | 2006/117710 A1 | 11/2006 |
| WO | 2011/098191 A1 | 8/2011 |

OTHER PUBLICATIONS

Notice of Reasons for Rejection dated Jun. 25, 2019, of counterpart Japanese Application No. 2018-521912, along with an English Translation.

* cited by examiner

ASSEMBLY INCLUDING A CARRIER HAVING A GLASS MATERIAL AND AN OPTOELECTRONIC SEMICONDUCTOR COMPONENT

TECHNICAL FIELD

This disclosure relates to an assembly comprising a carrier comprising a glass material with an optoelectronic semiconductor component, and a method of producing an assembly comprising a carrier comprising a glass material and an optoelectronic semiconductor component.

BACKGROUND

DE 10 2014 100 584 A1 discloses a method of producing optoelectronic semiconductor components and an optoelectronic semiconductor component, wherein the optoelectronic semiconductor component is arranged on a glass carrier or in a recess of the glass carrier. The semiconductor component mechanically connects to the glass carrier via a filling medium comprising silicone, for example.

There is nonetheless a need for an improved assembly comprising a carrier comprising a glass material and an optoelectronic semiconductor component connected to the carrier and an improved method of producing an assembly comprising a carrier comprising a glass material and an optoelectronic semiconductor component.

SUMMARY

We provide an assembly including a carrier including a glass material, including at least one recess, wherein at least one optoelectronic semiconductor component is arranged in the at least one recess of the carrier, and at least one surface of the semiconductor component connects to the carrier via a melted surface including glass.

We also provide a method of producing the assembly including a carrier including a glass material, including at least one recess, wherein at least one optoelectronic semiconductor component is arranged in the at least one recess of the carrier, and at least one surface of the semiconductor component connects to the carrier via a melted surface including glass, including providing a carrier including a glass material, providing a substrate for an optoelectronic semiconductor component, connecting at least one surface of the substrate to the carrier via a melted surface including glass, and arranging the substrate in a recess of the carrier.

LIST OF REFERENCE SIGNS

1 Carrier
2 Surface
3 Semiconductor component
4 Recess
5 Front side
6 First side surface
7 Second side surface
8 Third side surface
9 Emission direction
10 First conductor track
11 Second conductor track
12 Top side
13 Mirror layer
14 Active zone
15 First contact pad
16 Second contact pad
17 Glass material
18 Conversion material
19 Bottom surface
20 Trench
21 First side surface
22 Second side surface
23 First SMD contact
24 Second SMD contact
25 First contact pin
26 Second contact pin
27 Front side
28 Optical structure
29 Substrate

DETAILED DESCRIPTION

One advantage of our assembly is that a secure connection exhibiting long-term stability between the carrier comprising glass material and the semiconductor component is achieved. In particular, the connection is insensitive to aging vis-à-vis heat and light. This advantage is achieved by the fact that the semiconductor component connects to the carrier via a melted surface comprising glass. In this way, organic substances are dispensed with in forming the mechanical connection between the carrier and the semiconductor component.

At least a front side of the semiconductor component may connect to the carrier via the melted surface comprising glass. A large-area coupling between the semiconductor component and the carrier is achieved by the connection via the front side. Further sides of the semiconductor component may also connect to the carrier by a melted surface comprising glass. The front side may be the side via which electromagnetic radiation is emitted or taken up by the semiconductor component. The optoelectronic semiconductor component may be formed as a light emitting chip or as a sensor chip. The light emitting chip may be formed as a light emitting diode or as a laser diode. The sensor chip may be configured to receive electromagnetic radiation. In particular, the sensor chip may be formed as an optical sensor or as a solar cell.

At least one side surface of the semiconductor component may connect to the carrier via a melted surface comprising glass. A connection only via one side surface may be sufficient for the semiconductor component to be securely fixed to the carrier. Furthermore, a plurality of side surfaces, in particular all side surfaces, of the semiconductor component may connect to the carrier via a melted surface comprising glass. Moreover, in addition to the side surfaces, a front side of the semiconductor component may also connect to the carrier via a melted surface comprising glass. Moreover, in addition to the side surfaces, both front sides of the semiconductor component may also connect to the carrier via a melted surface comprising glass. The electrical contacting of the semiconductor component is then led via feedthroughs through the carrier to the semiconductor component.

In the configuration in which the semiconductor component connects to the carrier via at least one side surface, the front side of the semiconductor component may be arranged in a manner free of the carrier, wherein the semiconductor component is arranged in a continuous recess of the carrier and laterally connects to the carrier.

The melted surface may be formed from the same glass material as the carrier. Consequently, by heating the carrier and contacting the semiconductor component with the carrier, it is possible to form the melted surface between the carrier and the semiconductor component. The melted surface is thus formed materially uniformly from the same material as the carrier. This enables the semiconductor component to be fixed to the carrier securely and with long-term stability. Furthermore, as a result, optoelectronic properties of the carrier are maintained without any significant change even in the region of the melted surface. In particular, a refractive index of the glass material of the carrier is even substantially maintained in the region of the melted surface. It is thus possible to achieve a defined propagation of electromagnetic radiation in the transition region between the semiconductor component and the carrier. This is advantageous in particular if the optoelectronic semiconductor component is formed as a light emitting chip, in particular as a light emitting diode or as a laser diode. This property is also advantageous when the semiconductor component is formed in the form of a sensor.

The melted surface may be formed from a glass material arranged for the connection process between the carrier and the semiconductor component. The glass material may substantially comprise a composition similar or identical to that of the glass material of the carrier. Furthermore, however, the glass material used to form the melted surface may also comprise a different composition than the glass material of the carrier. It is thus possible to define an individual adaptation of the mechanical, chemical and/or optical properties of the melted surface independently of the glass material of the carrier. An increased flexibility and in particular a controlled formation of the melted surface are made possible as a result.

Conversion material may be arranged in the melted surface. An electromagnetic radiation emitted by the optoelectronic component may thus be shifted at least partly to a different wavelength. Arrangement of the conversion material in the melted surface enables a compact and simple construction of the assembly.

The semiconductor component may comprise electrical contacts, wherein conductor tracks are arranged on the semiconductor component and on the carrier, the conductor tracks being led to the electrical contacts of the semiconductor component. This results in an increased flexibility in the arrangement of the conductor tracks.

The conductor tracks may be sintered into a top side of the carrier. A stable fixing of the conductor tracks to the carrier is achieved in this way. In particular, sintering the conductor tracks may be combined with cooling the carrier during production. Consequently, the high temperature of the carrier required to connect the carrier to the semiconductor component may simultaneously be utilized to form the conductor tracks, in particular to form metallic conductor tracks.

The semiconductor component may at least partly comprise a material transmissive to electromagnetic radiation. In particular, the semiconductor component may be formed as a light emitting chip. In this case, it is advantageous if the light emitting chip comprises a material transmissive to the electromagnetic radiation emitted by the light emitting chip. By way of example, the light emitting chip may comprise a sapphire material. In this example, the light emitting chip may emit in all directions.

The recess may be formed in the form of a hole extending through the carrier, wherein a front side of the semiconductor component is assigned to an open surface of the recess. In this way, an electromagnetic radiation taken up or emitted by the semiconductor component need not pass through the glass material of the carrier. A reception characteristic and/or an emission characteristic of the semiconductor component in the assembly described may thus be improved or varied.

A plurality of carriers with a semiconductor component may each be arranged one above another. This is advantageous in particular if the semiconductor component is formed from a light emitting chip. Consequently, in a small planar formation, a high luminance may be achieved by the height-offset and laterally offset light emitting chips. Moreover, light emitting chips that emit different wavelengths may be arranged in the carriers. By way of example, light emitting chips that emit blue light, red light and green light may be provided. In particular, light emitting chips comprising different wavelengths may be provided to generate a mixed light comprising a desired color. By way of example, a light emitting chip that generates blue light, a light emitting chip that generates red light and a light emitting chip that generates green light may be provided in the carrier to generate white mixed light. Moreover, light emitting chips that generate infrared light or UV light may also be arranged in the carrier. When UV light is generated, the carrier comprising glass material comprises the advantage that the carrier exhibits long-term stability vis-à-vis UV light.

The carrier may comprise elements that influence the radiation, in particular mirror surfaces, color particles and/or radiation guiding structures. A compact component comprising the additional functions is provided as a result.

The carrier may comprise a porous first glass material into which a second glass material comprising a lower melting point is introduced, in particular infiltrated, in a manner at least adjoining the semiconductor component. The first glass material comprises a higher melting point than the second glass material. Moreover, the first glass material may be formed in the form of a glass frit, into which the second glass material is infiltrated. The carrier may consist of the porous first glass material, wherein the second glass material is introduced into the entire carrier.

At least one side surface of the carrier adjoining the surface may be arranged at an inclination. The side surface may be used, for example, for an optical inspection of a solder connection. If a component is fitted onto the surface of the assembly with a contact via a solder connection, then excess solder is forced laterally onto the inclined side surface. The presence of solder on the inclined surface may be used, for example, with an optical inspection to check a correctly implemented solder connection.

Our method has the advantage that the semiconductor component connects to the carrier via a melted surface comprising glass. In this way, organic material may be dispensed with in forming the connection surface. This results in an increased stability vis-à-vis electromagnetic radiation and/or heat.

The substrate for the semiconductor component or the semiconductor component may be pressed into a glass melt of the carrier and, in this way, in addition to formation of the melted surface, the recess may also be at least partly introduced into the carrier. The carrier may already comprise a partial recess before the substrate or the semiconductor component is pressed in. Moreover, the carrier may comprise a plane surface into which the substrate or the semiconductor component is pressed.

Furthermore, formation of the melted surface may be produced by a glass material introduced between the carrier and the substrate or the semiconductor component. As a result of corresponding heating of the glass material, the glass material is liquefied such that a melted surface may form at at least one surface of the substrate or of the semiconductor component. After cooling the glass material, a stable melted surface has been formed from the glass material, wherein the melted surface has been formed both at the substrate or at the semiconductor component and at the carrier. In this example, too, it is possible to dispense with organic materials for mechanical and/or optical coupling between the carrier and the semiconductor component or between the carrier and the substrate.

The substrate or the semiconductor component may comprise no metallic contacts or conductor tracks before the process of forming the melted surface. As a result, it is possible to use higher temperatures during formation of the melted surface.

The semiconductor component may comprise metallic contacts and/or metallic conductor tracks before the process of forming the melted surface.

After the process of arranging the substrate in the recess of the carrier, the optoelectronic semiconductor component may be produced on the substrate, wherein in particular an active zone that receives and/or generates electromagnetic radiation is formed on the carrier in a manner adjoining the recess. The active zone is formed in particular as an epitaxial layer, wherein the epitaxial layer on the substrate and on the carrier is formed substantially with the same structure. In this way, a short-range order of a patterned substrate, in particular of a patterned sapphire substrate, may be transformed into a long-range order of the active zone on the carrier. The epitaxial layer may form with the same structure as on the substrate at least a few µm or a few mm or more in a lateral direction away from the recess on the carrier. Consequently, an active zone may also be formed laterally alongside the recess on the carrier.

Before the process of introducing the substrate into the recess of the carrier, an active zone that transmits and/or receives electromagnetic radiation is deposited on the substrate and an optoelectronic semiconductor component is produced.

The above-described properties, features and advantages and the way in which they are achieved will become clearer and more clearly understood in association with the following description of examples explained in greater detail in association with the drawings.

The proposed assemblies and the proposed methods are described below on the basis of the example of an optoelectronic semiconductor component in the form of a light emitting chip. The light emitting chip may be formed as a light emitting diode or as a laser diode. Instead of the light emitting chip, the optoelectronic semiconductor component may also be formed in the form of a sensor, in particular in the form of an optical sensor. The sensor may be formed as an optical sensor that receives an electromagnetic radiation. Moreover, the sensor may be formed as a solar cell. The semiconductor component may be constructed on a sapphire carrier on which an active zone, for example, that transmits and/or receives electromagnetic radiation is arranged. The active zone may be applied in the form of an epitaxial layer on the sapphire carrier. Furthermore, the semiconductor layer comprising the active zone may already comprise metallic contacts and/or metallic conductor tracks. Any other semiconductor material suitable for the production of an optoelectronic semiconductor component may also be used instead of sapphire.

Figure 1:
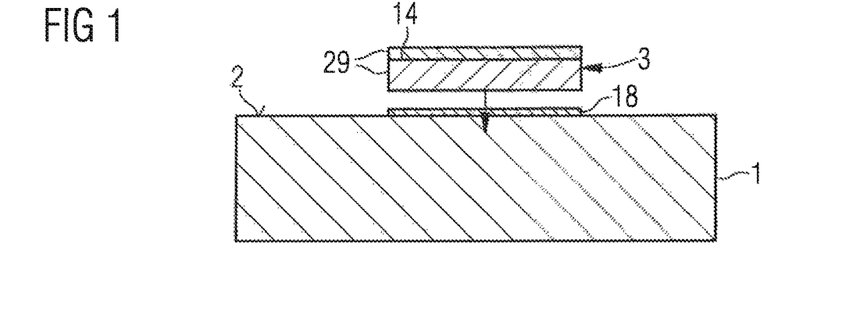
FIGS. 1-4 show a first method of producing an assembly comprising a carrier and a semiconductor component.

FIG. 1 shows three method steps of producing an assembly comprising a semiconductor component 3 in a recess 4 of a carrier 1 comprising a glass material. The semiconductor component 3 comprises a substrate 29 and an active zone 14 for transmitting and/or for receiving electromagnetic radiation. The substrate 29 may be formed from sapphire, for example. Embedding the semiconductor component 3 into the carrier 1 is described below. The active zone 14 may also be deposited on the substrate 29 only after the formation of the melting connection between the substrate 29 and the carrier 1 and a semiconductor component 3 may thus be obtained only after the formation of the melting connection between the substrate and the carrier 1.

FIG. 1 shows a carrier 1 in schematic side view, wherein the carrier 1 is formed in the form of a glass plate. The carrier 1 is heated to a sufficient extent until a melting point of the glass material is reached and the carrier 1, at least in the region of a surface 2, becomes so soft that an optoelectronic semiconductor component 3 may automatically sink or may be at least partly pressed into the surface 2.

FIG. 1 shows the optoelectronic semiconductor component 3 prior to being pressed into the heated carrier 1. In FIG. 1, a layer of conversion material 18 is provided on the surface 2 below the semiconductor component 1. The conversion material 18 may additionally also be arranged laterally on the semiconductor component 3. The conversion material 18 may also be dispensed with.

Figure 2:
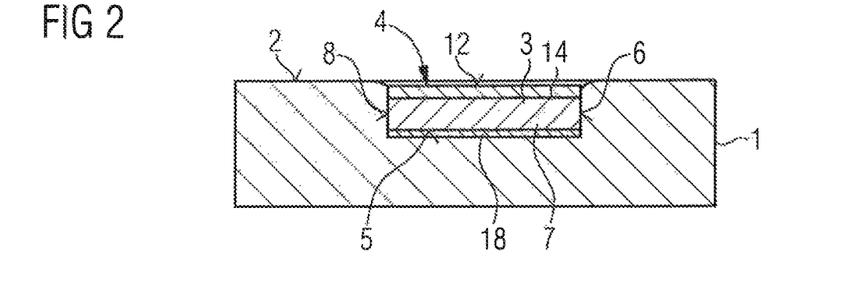

FIG. 2 shows the assembly comprising the carrier 1 after the semiconductor component 3 has been pressed into the carrier 1. Consequently, the semiconductor component 3 is arranged in a recess 4 of the carrier 1. Material of the carrier 1 may also be displaced in the process. In this example, after the cooling of the carrier 1, a solidified melted surface is formed both at a front side 5 and at all four side surfaces 6, 7, 8 of the semiconductor component 3, the melted surface mechanically and optically coupling the semiconductor component 3 to the glass material of the carrier 1. In this case, the melted surface may also partly reach a rear side of the semiconductor component 3, the rear side being situated opposite the front side 5. Moreover, the substrate 29 or the semiconductor component 3 may also be completely embedded in the carrier 1 such that all sides of the semiconductor component 3 are concomitantly covered by the carrier 1.

The melted surface is formed from the same material as the carrier 1 and enables a secure and stable mechanical connection, in particular exhibiting long-term stability, between the semiconductor component 3 and the carrier 1. In particular, when the carrier 1 is formed from a glass material, the melted surface exhibits long-term stability vis-à-vis heat and/or electromagnetic radiation. In the region of the front side 5, as illustrated in the example, conversion material 18 may be mixed into the melted surface and adjoining regions of the carrier 1. Furthermore, the carrier 1 in a region adjoining the front side 5 may comprise a refractive index matched to the material of the semiconductor component 3. The refractive index, with increasing distance from the front side 5, may approximate to the normal refractive index of the material of the carrier 1. By way of example, in the region adjoining the front side 5 particles may be arranged in the material of the carrier 1, the concentration of the particles decreasing with increasing distance from the front side 5. By way of example, in a carrier 1 comprising glass, the particles may consist of silver and/or thallium and/or of nanoparticles to raise the refractive index in the direction of the front side 5 in the carrier 1. This improves a light transmission, in particular a coupling-out of light between the semiconductor component 3 and the carrier 1.

Figure 3:
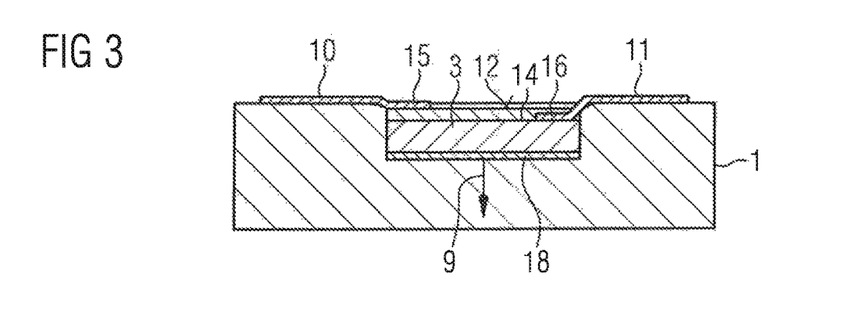

Afterward, as illustrated in FIG. 3, electrical contacts 15, 16 and conductor tracks 10, 11 may be applied on the semiconductor component 3 and on the surface 2 of the carrier 1. The metal contacts and the conductor tracks may comprise metals, in particular may be formed from metal. Vapor deposition methods and photolithography methods may be used in this case. In the example illustrated, the front side 5 constitutes the emission side, via which electromagnetic radiation is emitted in an emission direction 9 over the front side 5 of the semiconductor component 3. FIG. 3 schematically illustrates a first and a second conductor track 10, 11 arranged on a top side of the semiconductor component 3 and on the surface 2 of the carrier 1. An active zone that transmits or receives an electromagnetic radiation may be arranged in an upper region of the semiconductor component 3 near the top side 12.

Figure 4:
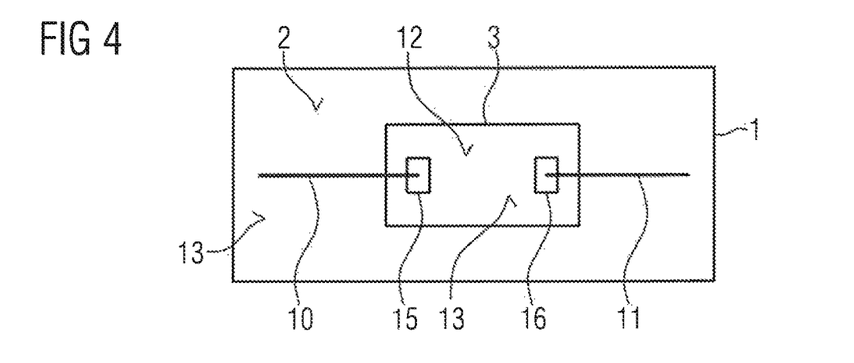

FIG. 4 shows a view from above of the surface 2 of the carrier 1. The surface 2 of the carrier 1 and the top side 12 of the semiconductor component 3 may be partly or completely coated with a mirror layer 13. The semiconductor component 3 is arranged in a recess 4 of the carrier 1. In this case, both the front side 5 and the side surfaces 6, 7, 8 connect to the glass material of the carrier 1 via a solidified melted surface. Furthermore, the surface 2 of the carrier 1 and the top side 12 of the semiconductor component 3 are covered with a mirror layer 13. Moreover, the semiconductor component comprises contact pads 15, 16 that electrically conductively connect, respectively, to a conductor track 10, 11. The contact pads 15, 16 and the conductor tracks 10, 11 are formed from an electrically conductive material, in particular from metal. The conductor tracks 10, 11 may be sintered into the surface 2 of the carrier 1. In this case, it is possible to use the high temperature of the carrier 1 after the fusing process of the semiconductor component, that is to say that the conductor tracks are applied on the still hot carrier 3. The mirror layer 13 is formed above the conductor tracks 10, 11. During sintering of the conductor tracks 10, 11, the conductor tracks 10, 11 are applied on the surface 2 of the carrier 1, while the surface 2 of the carrier 1 still comprises a very high temperature, for example, above 300° C. In this way, the high temperature of the surface 2 may be utilized for a sintering process of the conductor tracks 10, 11. The conductor tracks 10, 11 are produced from metal, for example.

Figure 5:
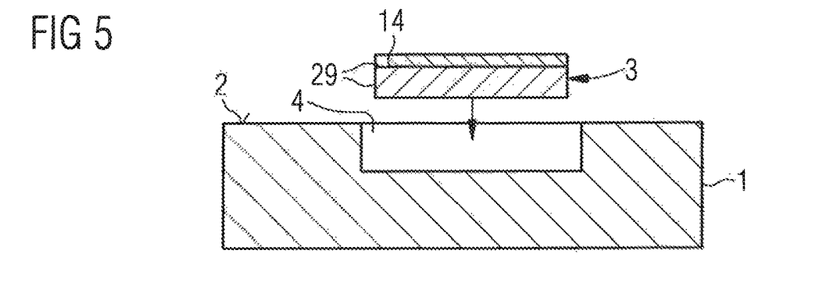
FIGS. 5-8 show a second method of producing an assembly comprising a carrier comprising glass material and a semiconductor component.
Figure 6:
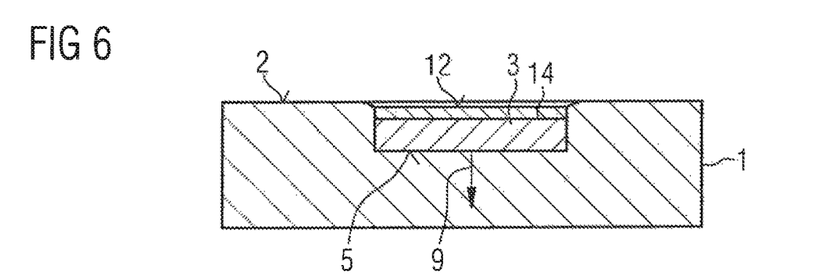
Figure 7:
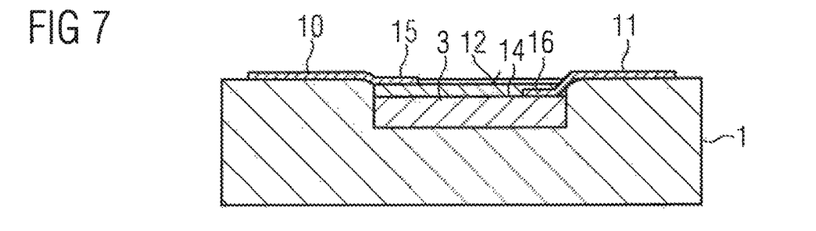

FIGS. 5 to 7 show various method steps of a further method of producing an assembly comprising a carrier 1, wherein a semiconductor component 3 is arranged in a recess 4 of the carrier 1 comprising glass material and connects to the carrier 1 via a melted surface. FIG. 5 shows, in a schematic arrangement, a carrier 1 consisting of a glass material. A recess 4 is introduced into a surface 2 of the carrier 1. The recess 4 may substantially comprise the shape and the size of the semiconductor component 3 or may be somewhat larger in length and/or in width and/or in height. The optoelectronic semiconductor component 3 is inserted into the recess 4 as illustrated in FIG. 6. Afterward, the carrier 1, at least in the region of the recess 4, is heated to a sufficient extent that the glass material of the carrier 1 becomes soft and settles against at least one, in particular against all, surfaces of the semiconductor component 3. The assembly is subsequently cooled. In this way, the semiconductor component mechanically connects to the carrier 1 via melted surfaces comprising glass material of the carrier 1.

In a subsequent process step illustrated in FIG. 7, contact pads 15, 16 are applied on the top side 12 of the semiconductor component 3. Moreover, conductor tracks 10, 11 are applied on the top side 12 of the semiconductor component 3 and on the surface 2 of the carrier 1. The contact pads and/or the conductor tracks may comprise metal or be formed from metal. Vapor deposition methods and photolithography methods may be used for this purpose. Moreover, a mirror layer 13 may be applied on the top side 12 of the semiconductor component 3 and on the surface 2 of the carrier 1. In this example, too, conversion material may be arranged between the semiconductor component and the carrier, in particular in the region of the front side 5 of the semiconductor component before the melting process.

Figure 8:
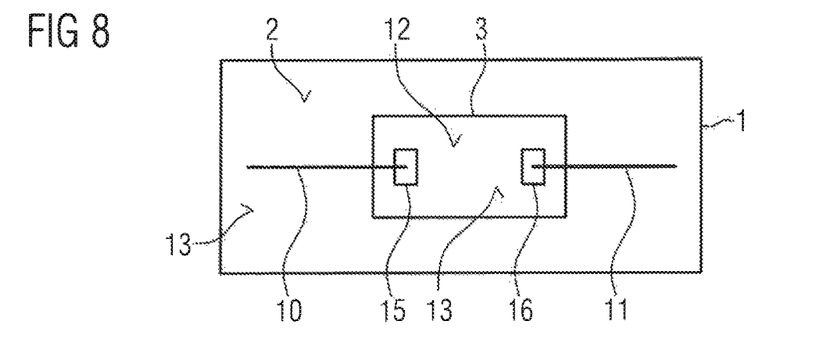

FIG. 8 shows a view of the arrangement from FIG. 7 from above. The conductor tracks 10, 11 may be sintered into the surface 2 of the carrier 1. The high temperature of the carrier 1 when melting around the semiconductor component 3 may be utilized for this purpose.

In the method of FIGS. 1 and 2, the electrical contact pads 15, 16 comprising electrically conductive material, in particular comprising metal, and the conductor tracks 10, 11, which may likewise comprise metal, may already be arranged on the semiconductor component 3 before the semiconductor component 3 is introduced into the carrier 1 and connected to the carrier 1 via at least one melted surface.

Figure 9:
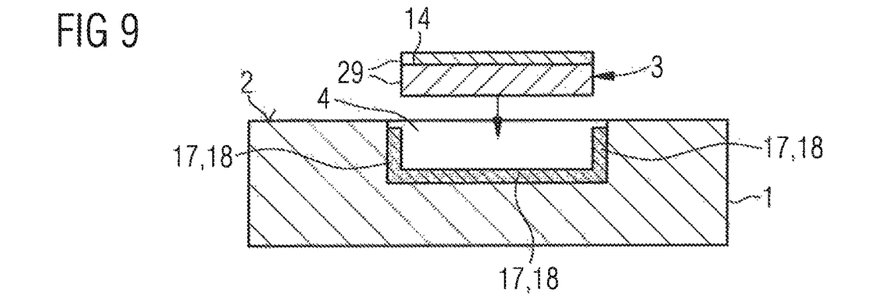
FIGS. 9-12 show a third method of producing a carrier with a semiconductor component.
Figure 10:
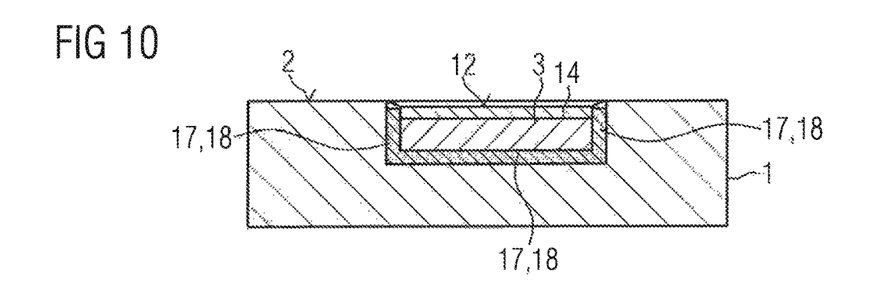

In accordance with a further method, the melted surface may be produced between the semiconductor component 3 and the carrier 1 with the aid of glass material 17 that is introduced between the semiconductor component 3 and the carrier 1 before the melting process. FIG. 3 shows corresponding method steps in a schematic illustration. In FIG. 9, a carrier 1 comprising a glass material comprising a recess 4 is provided. Glass material 17 is arranged into the recess 4 at least on one surface of the recess 4, in particular on all surfaces of the recess 4. The glass material 17 may be formed in the form of powder or paste or a pasty liquid. The glass material 17 may comprise a composition the same as or different from that of the glass material of the carrier 1. In particular, the glass material 17 may comprise a refractive index the same as or different from that of the glass material of the carrier 1. In this way, through a corresponding choice of the glass material 17 it is possible to achieve a thermal, optical, chemical and/or physical improved coupling between the semiconductor component 3 and the carrier 1. Moreover, conversion material 18 may be applied to the surfaces of the recess. The glass material 17 may be mixed with the conversion material 18. As is illustrated in FIG. 10, the semiconductor component 3 is inserted into the recess 4 and the process of melting around is subsequently carried out. In this case, at least the glass material 17 is heated to an extent such that a melted surface is formed at the semiconductor component 3 and/or at the carrier 1. The assembly is subsequently cooled. Moreover, the carrier 1 at least adjoining the recess 4 may also be heated to a sufficient extent that at least regions adjoining the recess 4 are liquefied and fuse with the glass material 17.

Figure 11:
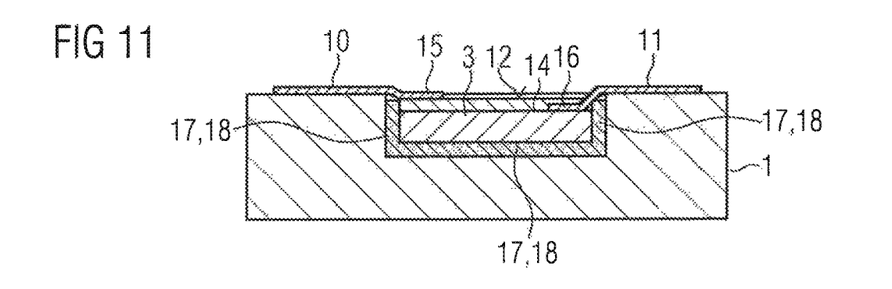

As illustrated in FIG. 11, contact pads 15, 16 and electrical conductor tracks 10, 11 may be applied on the top side 12 of the semiconductor component 3 and on the surface 2 of the carrier 1. The contact pads and/or the conductor tracks may comprise metal or may be formed from metal. Vapor deposition methods and photolithography methods may be used for this purpose.

Figure 12:
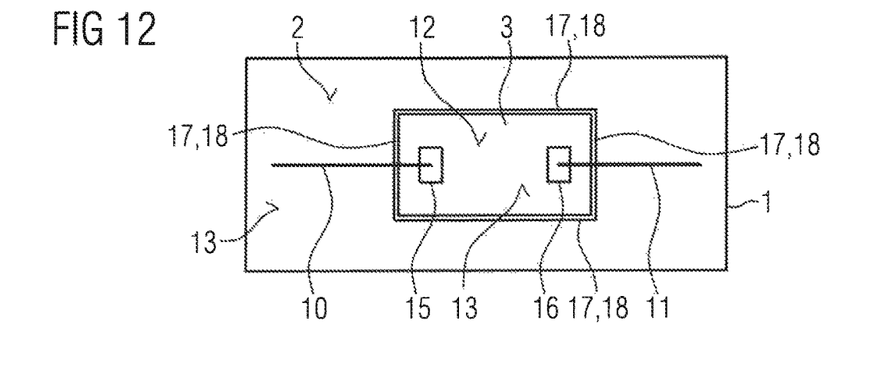

FIG. 12 shows, in a schematic illustration, a view from above of the arrangement from FIG. 11. In this case, a mirror layer 13 may additionally be applied on the surface 2 of the carrier 1 and on the top side 12 of the semiconductor component 3.

Figure 13:
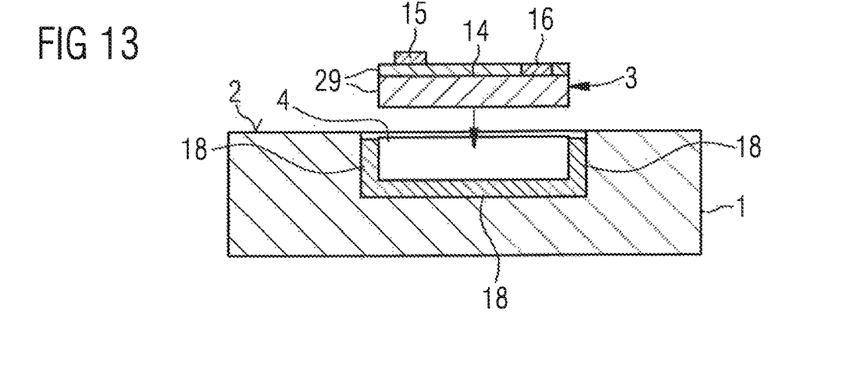
FIGS. 13-15 show a fourth method of forming an assembly comprising a carrier and a semiconductor component.
Figure 14:
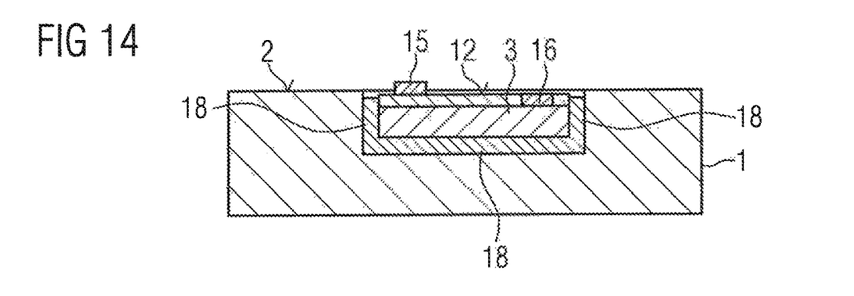
Figure 15:
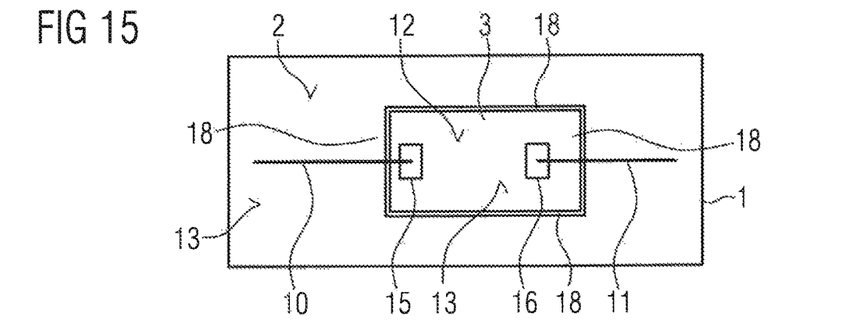

In the same way as the glass material 17, instead or additionally a conversion material 18 may be introduced between the carrier 1 and the semiconductor component 3. FIGS. 13 to 15 show a corresponding method in which a conversion material 18 is arranged at surfaces of the recess 4, in particular at a bottom surface of the recess 4. FIG. 13 shows the method step in which the semiconductor component 3 is inserted into the recess 4, wherein between the semiconductor component 3 and the carrier 1 conversion material 18 is arranged in particular in the region of the front side 5. Moreover, in this example, the semiconductor component 3 comprises contact pads 15, 16 comprising metal. In the other methods, too, the semiconductor component 3 might comprise contact pads 15, 16 before the melting process. Moreover, in this method, a semiconductor component without contact pads might also be used.

Afterward, as illustrated schematically in FIG. 14, the carrier 1 is heated to a sufficient extent that the conversion material 18 is taken up into the glass material of the carrier 1 and additionally a melted surface comprising the glass material of the carrier 1 mixed with the conversion material 18 is formed at side surfaces of the semiconductor component 3.

FIG. 15 shows, in a schematic view from above, the assembly from FIG. 14, wherein the semiconductor component 3 connects to the carrier 1 via melted surfaces both at the side surfaces and at the front side 5. Moreover, conversion material 18 is formed in the region of the melted surface in the carrier 1. Prior to melting around the semiconductor component 3 or after melting around the semiconductor component 3, it is possible for contact pads 15, 16 to be applied on the top side 12 of the semiconductor component 3. Moreover, electrical conductor tracks 10, 11 that are electrically conductively connected to the contact pads 15, 16 may be applied on the surface 2 of the carrier 1 and on the top side 12 of the semiconductor component 3. Furthermore, a mirror layer 13 may be applied on the surface 2 of the carrier 1 and on the top side 12 of the semiconductor component 3.

Figure 16:
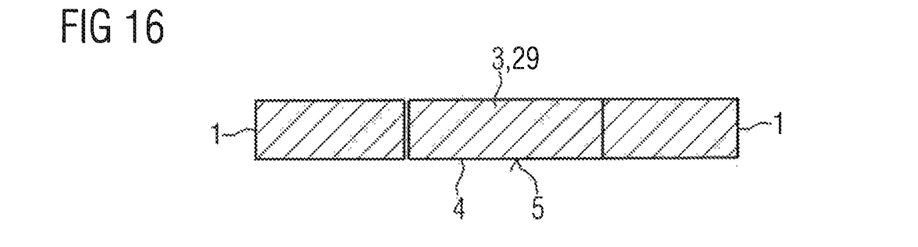
FIG. 16 shows a further example of a carrier with a semiconductor component.
Figure 17:
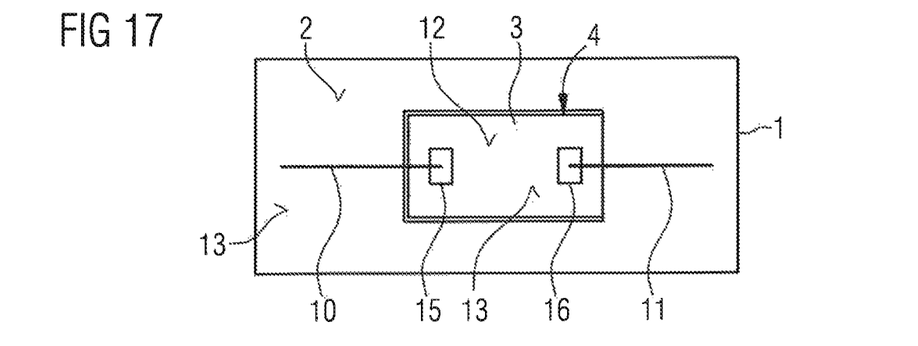
FIG. 17 shows a view of the assembly from FIG. 16 from above.

FIG. 16 shows a further example in a schematic cross-sectional illustration, in which example the carrier 1 comprises a continuous recess 4 in which the semiconductor component 3 is arranged. In this example, the semiconductor component 3 connects to the carrier 1 via a melted surface only by way of at least one side surface. In this example, a front side 5 of the semiconductor component 3 is free of the melted surface and free of material of the carrier 1. Also, the melted surface may have been produced by the material of the carrier 1. Moreover, however, glass material 17 may also have been arranged between at least one side surface of the semiconductor component 3 and the surfaces of the recess 4 of the carrier 1 and have been converted to a melted surface. Moreover, as illustrated in FIG. 17, on the semiconductor component 3 it is possible to apply contact pads 15, 16 and conductor tracks 10, 11 that extend onto the surface 2 of the carrier 1.

Figure 18:
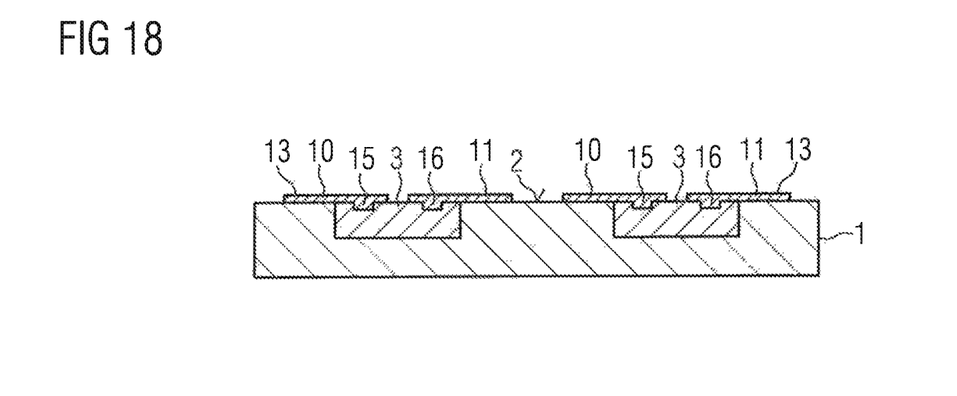
FIG. 18 shows a further assembly comprising mirror layers.

FIG. 18 shows, in a schematic cross-sectional illustration, part of a carrier 1 with two semiconductor components 3 comprising contact pads 15, 16, wherein the contact pads 15, 16 connect to conductor tracks 10, 11, which are led onto the surface 2 of the carrier 1. Furthermore, a mirror layer 13 is applied to the surface 2 of the carrier 1 and on the top side 12 of the semiconductor components 3.

Figure 19:
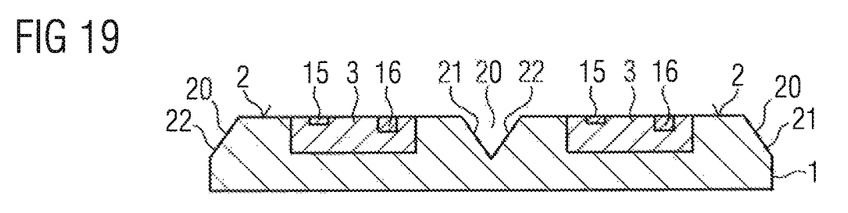
FIGS. 19-21 show a method of producing a carrier with a semiconductor component comprising SMD contacts.
Figure 20:
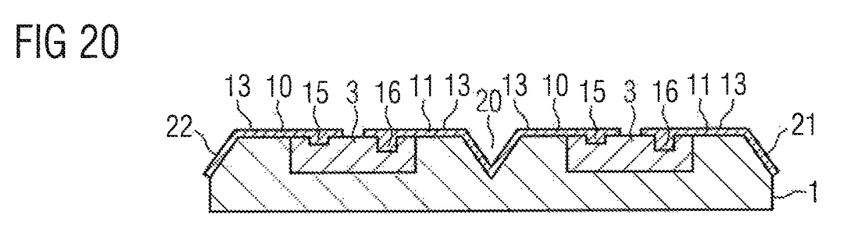
Figure 21:
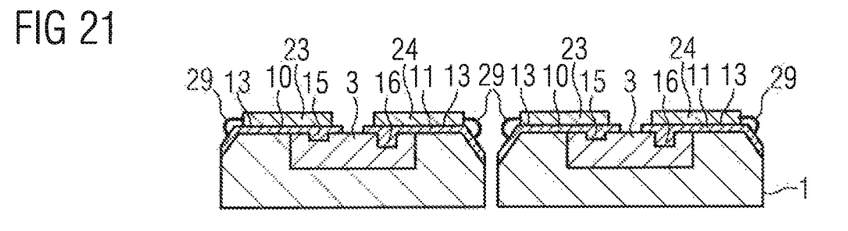

FIGS. 19 to 21 show method steps of producing a carrier 1 with a plurality of semiconductor components that are subsequently singulated. FIG. 19 illustrates part of a carrier 1. The carrier 1 comprises a plurality of semiconductor components 3 produced with a melted surface comprising glass by at least one of the methods described. Between the semiconductor components 3, trenches 20, for example, in the form of V-trenches are introduced into the surface 2 of the carrier 1. Afterward, conductor tracks 10, 11 and a mirror layer 13 are applied on the surface 2 of the carrier 1. In this case, the side surfaces 21, 22 of the trenches 20 are also covered with the mirror layer 13. This method state is illustrated in FIG. 20.

Afterward, SMD contacts 23, 24 are applied on the conductor tracks 10, 11 of the semiconductor components 3, as illustrated in FIG. 21. The SMD contacts connect to the contact pads 15, 16 and/or to the conductor tracks 10, 11, for example, with the aid of solder 29 via a solder connection. During formation of the solder connection, solder material 29 is forced laterally via the SMD contacts 23, 24 onto the inclined side surface 21, 22. In this case, by an optical inspection of the side surfaces 21, 22, it is possible to check whether solder material is present. If no solder material is present, then this may indicate a faulty solder connection between the contact pad and/or the conductor track and the SMD contact. Other contacts may also be provided instead of SMD contacts. Moreover, instead of SMD contacts, electronic components may also directly connect to the semiconductor component.

Figure 22:
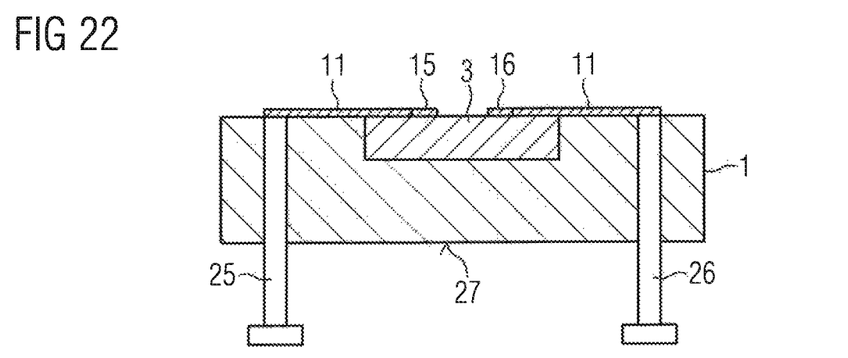
FIG. 22 shows a carrier with contact pins.

In a further example illustrated schematically in FIG. 22, the carrier 1 may additionally comprise contact pins 25, 26. The contact pins 25, 26 may be plugged into the soft carrier 1, for example, during the melting around process. In the example illustrated, the contact pins 25, 26 project from a front side 27 of the carrier 1. The contact pins 25, 26 may be formed from an electrically conductive material, for example, metal and in an end region may adjoin the conductor tracks 10, 11 and be electrically contacted with the conductor tracks 10, 11. Consequently, the contact pins 25, 26 may be used for the mounting of the carrier 1 and simultaneously for the electrical contacting of the conductor tracks and thus of the semiconductor components 3. The contact pins 25, 26 may also project from the surface 2 of the carrier 1.

The carrier 1 consists, for example, of a glass comprising a low melting point, which already at a temperature of 300° C. comprises a corresponding viscosity to form a melted surface between the carrier 1 and the semiconductor component 3.

Figure 23:
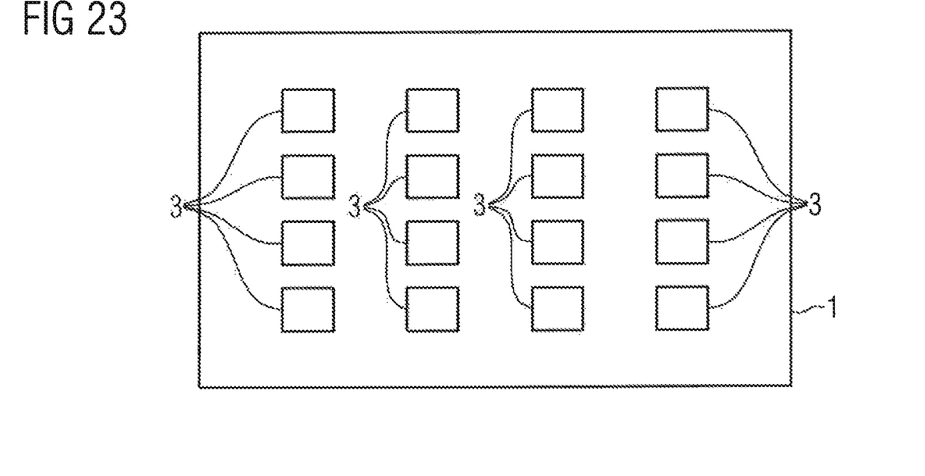
FIG. 23 shows a carrier with a plurality of semiconductor components.

FIG. 23 shows a carrier 1 in a schematic view from above, into which carrier a multiplicity of semiconductor components 3 have been introduced in accordance with one of the methods described above. The semiconductor components 3 mechanically connect to the carrier 3 at least via a melted surface comprising a glass material. Contact pads and conductor tracks have not been illustrated in the illustration chosen. The carrier 1 may be singulated into subunits comprising at least one or a plurality of semiconductor components.

Figure 24:
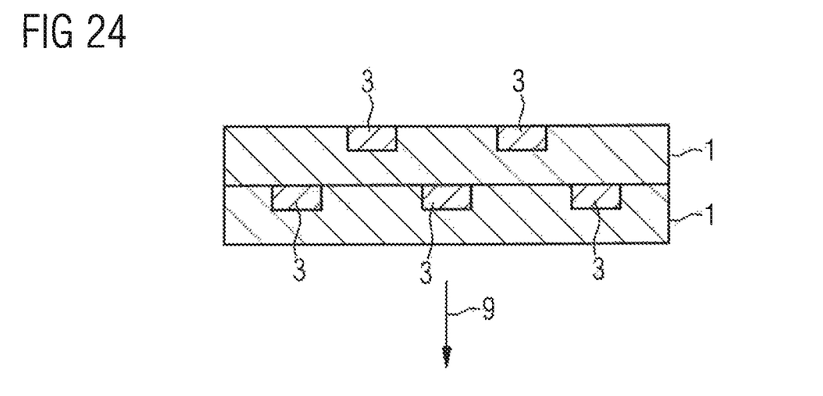
FIG. 24 shows an assembly comprising two carriers with semiconductor components, the carriers being arranged one above the other.

FIG. 24 shows a schematic cross section through an assembly in which two carriers 1 which, for example, are formed in accordance with FIG. 23 and produced in accordance with one of the preceding methods, are arranged one above the other. Each carrier 1 comprises a plurality of semiconductor components, in particular light emitting chips. In a lower carrier 1, three semiconductor components 3 in the form of light emitting chips are arranged in a series. In the upper carrier 1, two semiconductor components 3 are arranged in a series. Both the upper carrier and the lower carrier may comprise a plurality of series of semiconductor components. Both the light emitting chips 3 of the upper carrier 1 and the light emitting chips 3 of the lower carrier 1 are arranged such that they comprise a common emission direction 9 downward. With the aid of this assembly, it is possible to achieve a high luminance in a small planar formation of the arrangement. Only one semiconductor component or a plurality of semiconductor components 3, in particular light emitting chips, may be arranged in each of the two carriers. Moreover, more than one carrier may also be arranged one above another. Moreover, the light emitting chips may consist of a material transmissive to the emitted electromagnetic radiation. In particular, the light emitting chips may be formed on the basis of sapphire. Individual details such as the arrangement of the conductor tracks, the arrangement of conversion material and the like are not explicitly illustrated in the illustration in FIG. 24. The carriers 1 may have been produced in accordance with one of the methods described above.

A semiconductor component 3 may be formed, for example, in the form of a luminescence diode and comprise a sapphire carrier with an AlGaNIn epitaxial layer. With the aid of the methods described, organic compound materials may be dispensed with and the semiconductor components may be embedded into an inorganic glass matrix.

With the aid of the methods described, the semiconductor components are at least partly melted into glass, wherein the active layer, in particular the semiconductor epitaxial layer, is freely accessible and may be processed further. Consequently, structures, contact pads, redistribution wiring layers and/or mirror surfaces may subsequently be applied on the carrier and/or on the semiconductor component 3.

Consequently, as an intermediate stage it is possible to produce a panel, i.e. a carrier with a multiplicity of semiconductor components, in particular luminescence diodes, embedded in glass. In this case, the contact side of the semiconductor components is exposed and is freely accessible. Furthermore, the fine and virtually imperceptible electrical conductor tracks 10, 11 may subsequently be applied on the semiconductor components and on the top side of the carrier, for example, by screen printing methods.

In a first method variant allowing particularly high temperatures, for example, above 800° C. to drive out nitrogen during the process of melting around the semiconductor component, the semiconductor components embedded into the carrier are free of metallic contact layers and/or mirror layers and/or conductor tracks. In a further method variant allowing the semiconductor component to be fused at lower temperatures, for example, finished prefabricated semiconductor components, in particular light emitting chips, that is to say in particular luminescence diodes, comprising metallic contact pads, mirror surfaces and conductor tracks are at least partly fused into the carrier.

Prefabricated light emitting diodes are embedded with metallic contact pads, mirror surfaces and redistribution wiring layers into the carrier. Alternatively, it is possible to produce a carrier which only laterally encloses the semiconductor components and the contact side of which and the opposite front side of which remain openly accessible.

Embedding is carried out inorganically either by heating the carrier or melting a glass material arranged between the carrier and the semiconductor component. The glass material may be intermixed with a phosphor. Alternatively, phosphor may be applied into the recess of the carrier or on the carrier and be concomitantly fused into the melted surface. Moreover, not just one semiconductor component, but a plurality of optoelectronic semiconductor components, in particular light emitting chips, may be embedded into a recess 4 of the carrier 1 and connected to the carrier 1 by melted surfaces.

By way of example, the optoelectronic semiconductor components may be formed in the form of light emitting chips, in particular in the form of light emitting diodes comprising different wavelengths of the emitted electromagnetic radiation. By way of example, three light emitting diodes may be arranged in one recess 4, wherein a first light emitting diode emits red light, a second light emitting diode emits green light and a third light emitting diode emits blue light.

Figure 25:
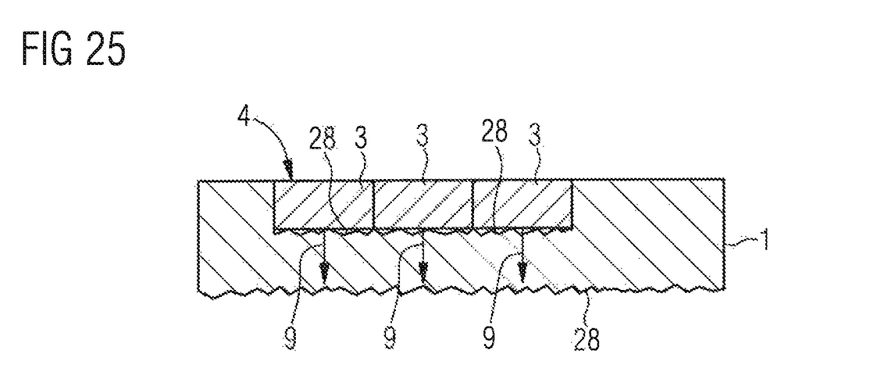
FIG. 25 shows a carrier with three semiconductor components in one recess.

A corresponding assembly is illustrated schematically in FIG. 25. The carrier 1 may comprise optical structures 28 both in the region of the recess 4 and on an emission side, the optical structures enabling the electromagnetic radiation to be guided. The optical structures may be formed in the form of concave and/or convex surfaces. Moreover, the optical structures may be formed in the form of lenses or reflectors or mirrors. The optical structures 28 may also be configured to enable a mixing, i.e. a scattering of the different-colored electromagnetic radiations of the semiconductor components. Consequently, the light from the three different light emitting diodes may appear as a homogeneous light source.

The carrier or carriers 1 may be formed in the form of plane plates or in the form of bent plates or in the form of plates comprising a plurality of height-offset surfaces.

The process of fusing the semiconductor components may be carried out during the glass drawing method in a liquid state of the carrier, for example, on a tin bath.

In the arrangement in FIG. 23, the semiconductor components 3 of the two carriers 1 may comprise light emitting diodes that emit electromagnetic radiation comprising different wavelengths. Consequently, in this assembly, too, red, green and blue light may be mixed well and a homogeneous light may be generated. Furthermore, what may be achieved in the case of the stacked arrangement in FIG. 24 is that the conductor tracks or the semiconductor components themselves are less visible.

Moreover, the carrier 1 may already comprise color particles and thus be colored and/or comprise black coloration.

The methods and assemblies enable the semiconductor components to be embedded into a glass matrix in a stable manner vis-à-vis radiation. Coupling-out the electromagnetic radiation, for example, when the optoelectronic semiconductor components are formed as light emitting chips is carried out here directly in glass. The refractive index of the glass material of the carrier may be matched to the material of the semiconductor component or at least approximated to the refractive index of the semiconductor component. Furthermore, the carrier may be used directly as an optical waveguide, for example, for backlighting or the like such as, for example, in a cellular phone. Furthermore, an increased thermal conductivity is provided on account of embedding into the carrier comprising a glass material such that an improved cooling of the semiconductor components may be achieved by comparison with the use of organic embedding compounds.

The carrier comprising glass material may comprise a plurality of functions: mechanical luminaire and lamp carrier that may, for example, also be equipped with an SMD component; heat sink comprising rear-side metal tracks as mirror surfaces and to improve the heat spreading; light distributing and light shaping elements (lateral optical waveguides, diffusor surface, (TIR) prism surface); coupling-out element (prisms, lenses and the like); packaging material for semiconductor components, in particular for light emitting chips, in particular light emitting diodes and converters; platform for electrical leads; design element.

Formation of the recesses 4 may be produced, for example, with the aid of etching methods, deep-drawing methods, hot pressing, hot embossing, milling, drilling or grinding. SMD components such as, for example, drivers and/or sensors, may be applied on the carriers and in particular on the semiconductor components via corresponding contactings.

A wide variety of glass materials may be used as glass material for the carrier. In accordance with at least one example, a glass that melts at low temperature may be used as glass material. By way of example, the glass comprising a low melting point is a silicate glass, or borate glass or a phosphate glass. The silicate glass contains $SiO_2$ as main constituent, the borate glass contains $B_2O_3$ as main constituent, and the phosphate glass contains $P_2O_5$ as main constituent. The silicate glass may contain further metal oxides such as $B_2O_3$, $P_2O_5$, $Na_2O$, $K_2O$ and/or $AgO$, the borate glass may contain further metal oxides such as $SiO_2$, $P_2O_5$, $Na_2O$, $K_2O$, $PbO$ and $AgO$, and the phosphate glass may contain further metal oxides such as $B_2O_3$, $SiO_2$, $Na_2O$, $K_2O$ and/or $AgO$. A proportion of $AgO$ is, for example, at least 20% by weight or 40% by weight. By way of example, an inorganic glass such as e.g. a soda-lime glass may be used. Moreover, glasses that melt at a high temperature may also be used as glass material. Furthermore, glass mixtures may also be used as glass material. Moreover, it is also possible to use glass material in the form of a glass frit, into which a further glass material is infiltrated.

Although our assemblies and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2015 119 343.4, the subject matter of which is incorporated herein by reference.

The invention claimed is:

1. An assembly comprising a carrier comprising a glass material, comprising at least one recess, wherein at least one optoelectronic semiconductor component is arranged in the at least one recess of the carrier, at least one surface of the semiconductor component directly connects to the carrier via a melted surface comprising glass, the semiconductor component comprises contact pads, conductor tracks are arranged directly on a surface of the carrier and directly on the semiconductor component, the conductor tracks are guided from the carrier to the semiconductor component and connected with the contact pads, the conductor tracks are sintered conductor tracks, and the sintered conductor tracks are directly connected with a sinter layer to the surface of the carrier.

2. The assembly according to claim 1, wherein at least a front side of the semiconductor component directly connects to the carrier via the melted surface comprising glass.

3. The assembly according to claim 1, wherein at least one side surface of the semiconductor component directly connects to the carrier via a melted surface comprising glass.

4. the assembly of claim 1, wherein the surface of the carrier and the top side of the semiconductor component are covered with a mirror layer.

5. The assembly according to claim 1, wherein the melted surface is formed from glass material, and the glass material is arranged between the carrier and the semiconductor component and directly connects the carrier to the semiconductor component.

6. The assembly according to claim 1, wherein conversion material is arranged in the melted surface.

7. The assembly according to claim 1, wherein the semiconductor component at least partly comprises material trnsmissive to the electromagnetic radiation of the semiconductor component, and the semiconductor component comprises sapphire.

8. The assembly according to claim 1, wherein the recess is formed in the form of a hole extending through the carrier, and a front side of the semiconductor component is assigned to an open surface of the recess.

9. The assembly according to claim 1, wherein a plurality of carriers with at least one semiconductor component each are arranged one above another, the semiconductor components are formed as light emitting chips, and the light emitting chips emit different wavelengths of a red, a yellow and a blue wavelength spectrum to generate white light.

10. The assembly according to claim 1, wherein the semiconductor component is formed as a light emitting chip, a light emitting diode or a laser diode or a sensor that receives electromagnetic radiation or a solar cell.

11. The assembly according to claim 1, wherein the carrier consists of a porous first glass material into which a second glass material comprising a lower melting point is arranged in a manner at least adjoining the semiconductor component, and the second glass material forms the melted surface.

12. The assembly according to claim 1, wherein the optoelectronic semiconductor component comprises a substrate and an active zone that transmits and/or receives electromagnetic radiation, the active zone is arranged on the substrate, and the substrate is directly connected by the melted surface to the carrier.

13. The assembly according to claim 1, wherein the optoelectronic semiconductor component comprises a substrate and an active zone that transmits and/or receives electromagnetic radiation, the active zone is arranged on the substrate, and the active zone is directly connected by the melted surface to the carrier.

14. The assembly according to claim 1, wherein the semiconductor layer comprises the active zone, and the active zone comprises at least one of metallic contacts and metallic conductor tracks.

15. An assembly comprising a carrier comprising a glass material, comprising a recess, wherein an optoelectronic semiconductor component is arranged in the recess of the carrier, the optoelectronic semiconductor component comprises a substrate and an active zone, the active zone is arranged on the substrte, the active zone transmits and/or receives electromagnetic radiation, the substrate is directly connected by a melted surface comprising glass to the carrier, the active zone comprises metallic contacts and metallic conductor tracks, further conductor tracks are directly arragned on a surface of the carrier and connected to the contact pads of the active zone, and the further conductor tracks are sintered conductor tracks connected by sinter layer to the surfave of the carrier.

16. The assembly according to claim 1, wherein the conductor tracks are screen printed tracks.

17. The assembly according to claim 1, wherein the conductor tracks are conductor tracks connected by a fuse layer with the carrier.

18. A method of forming the assembly according to claim 1 comprising directly depositing conductor tracks on a surface of the carrier and on the semiconductor component to be connected to the contact pads, and sintering the conductor tracks to the surface of the carrier.

19. The method of claim 18, wherein the conductor tracks are applied on the surface of a hot carrier, the sintering of the conductor tracks to the surface of the carrier uses the high temperature above 300° C. of the carrier that is used to connect the carrier to the semiconductor component by the melted surface.

20. The method of claim 18, wherein the conductor tracks comprise metals, and a vapor deposition method and photolithography method is used to form the conductor tracks.

* * * * *